(12) United States Patent
Noda et al.

(10) Patent No.: US 6,517,998 B1
(45) Date of Patent: Feb. 11, 2003

(54) METHOD FOR REMOVING PHOTORESIST FILM AND APPARATUS USED THEREFOR

(75) Inventors: Seiji Noda, Tokyo (JP); Masaki Kuzumoto, Tokyo (JP); Izumi Oya, Tokyo (JP); Makoto Miyamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 15 days.

(21) Appl. No.: 09/614,252

(22) Filed: Jul. 12, 2000

Related U.S. Application Data

(63) Continuation of application No. PCT/JP99/06324, filed on Nov. 12, 1999.

(30) Foreign Application Priority Data

Nov. 13, 1998 (JP) .......................... 10-323503

(51) Int. Cl.⁷ ................................. G03F 7/42
(52) U.S. Cl. ................. 430/329; 430/311; 134/1.3
(58) Field of Search .............. 430/3, 311, 322, 430/329, 330; 134/1.3

(56) References Cited

U.S. PATENT DOCUMENTS

| | | | | |
|---|---|---|---|---|
| 5,464,480 A | * | 11/1995 | Matthews | ............ 134/1.3 |
| 6,080,531 A | * | 6/2000 | Carter | ............ 430/329 |
| 6,273,108 B1 | * | 8/2001 | Bergman | ............ 134/102.1 |

FOREIGN PATENT DOCUMENTS

| | | |
|---|---|---|
| JP | 57-180132 | 11/1982 |
| JP | 5-152270 | 6/1993 |
| JP | 5-259139 | 10/1993 |
| JP | 7-297163 | 11/1995 |
| JP | 11-165136 | 6/1999 |
| JP | 2000349006 A | * 12/2000 |

OTHER PUBLICATIONS

Kashkoush et al.; "A Novel Method for Photoresist Stripping using Ozone/De-ionized Water Chemistry", *IEEE*, pp. 81–84, 1997.

* cited by examiner

*Primary Examiner*—Kathleen Duda
(74) *Attorney, Agent, or Firm*—Leydig, Voit & Mayer, Ltd.

(57) ABSTRACT

A method of removing a photoresist film with high efficiency of removal and friendliness with the environment while reducing material consumption and cost for a ventilation facility, and an apparatus used for the method. The method of removing a photoresist film in a sealed system, includes supplying a photoresist film-removal mixture containing an ozonized gas and a photoresist film-remover to a photoresist film on a surface of a substrate through a photoresist film-remover supplier opposed to the photoresist film.

4 Claims, 8 Drawing Sheets

Coating thickness of photoresist film-remover (mm)

Distance between photoresist film and photoresist film-removable mixture supplier $\delta$ (mm)

METHOD FOR REMOVING PHOTORESIST FILM AND APPARATUS USED THEREFOR

This application is a continuation application of PCT international application No.PCT/JP99/06324 which has an international filing date of Nov. 12, 1999 which designated the United States, the entire contents of Which are incorporated by reference.

TITLE OF THE INVENTION

The present invention relates to a method of removing a film containing an organic composition, particularly to a method of removing a photoresist film containing an organic polymer composition used in a photolithographic process for producing a semiconductor device and the like, and to an apparatus used in the method.

DESCRIPTION OF THE RELATED ART

A photoresist material is generally used in a photolithographic process for forming a fine pattern and/or in a subsequent etching step for forming an electrode pattern in course of manufacturing a semiconductor device, such as an integrated circuit, a transistor, a liquid crystal device, a diode and the like.

For example, when a silicon oxide layer is formed in a desired pattern on a semiconductor substrate such as a silicon substrate (referred to as a silicon wafer), a silicon oxide layer is first deposited on the surface of the substrate and cleaned before a photoresist material suited for forming the desired pattern is applied to the silicon oxide layer to form a photoresist film. Then, a photo mask having a pattern corresponding to the desired pattern is placed on the photoresist film, exposed to light and then developed. Thereby, a photoresist film having the desired pattern, referred to as a photoresist pattern, is obtained. In the subsequent etching step, the silicon oxide layer is removed according to the resulting photoresist pattern. Finally, after the removal of the remaining photoresist film and the cleaning of the surface of the substrate, the silicon oxide layer is remained on the substrate in the desired pattern.

In the etching step, an art-known method of removing a part of the photoresist film unnecessary for the formation of the desired pattern includes, for example, [1] a method using an oxygen gas plasma and [2] a method using various oxidizing agents.

In the method using an oxygen gas plasma [1], an oxygen is introduced in the photoresist film under vacuum and a high voltage to generate an oxygen gas plasma. Then, the photoresist film is decomposed and removed by reacting with the oxygen gas plasma. However, there had been some problems in this method [1], including the requirement of an expensive apparatus for generating the oxygen gas plasma, a potential of damaging the substrate containing an electrical element due to the presence of charge carriers in the plasma, and the like.

Alternatively, as an example of the method [2] using various oxidizing agents to decompose and remove the photoresist film, for example, a method using hot concentrated sulfuric acid or a mixture of hot concentrated sulfuric acid and hydrogen peroxide as the oxidizing agent is known.

When using hot concentrated sulfuric acid, however, there is a disadvantage, such as an extremely high risk of heating strong sulfuric acid up to 150° C.

On the other hand, when using the mixture of hot concentrated sulfuric acid and hydrogen peroxide, a substance having an oxidizing and decomposing action is released according to the following scheme. In the scheme, on adding hydrogen peroxide to hot concentrated sulfuric acid heated to about 140° C., peroxosulfuric acid ($H_2SO_5$; generally referred to as Caro's acid) and an oxygen atom (O) are generated as follows:

$$H_2SO_4 + H_2O_2 \leftrightarrows H_2SO_5 + H_2O \qquad (1)$$

$$H_2O_2 \rightarrow O + H_2O \qquad (2)$$

The organic photoresist film may be oxidized by the strong acidity of both peroxosulfuric acid and oxygen atom to be converted to an inorganic substance. The inorganic substance is decomposed by reacting with hot concentrated sulfuric acid and then removed from the surface of the substrate.

However, as shown in the above schemes (1) and (2), this method [2] has a problem that, since a sulfuric medium is diluted with water produced upon every addition of hydrogen peroxide to hot concentrated sulfuric acid, the concentration of hot concentrated sulfuric acid after mixing is decreased with time. The method [2] also has disadvantages, including the extremely high risk as described for the method [1], i.e. the use of strong sulfuric acid at an elevated temperature, and the heat generated when mixing hot concentrated sulfuric acid with hydrogen peroxide, and the necessity system generating strong ventilation in order to operate the method in a clean room, and the like.

As another oxidizing agent used to decompose the photoresist film other than hot concentrated sulfuric acid, there has been developed a water-immiscible solution for exclusively removing a photoresist film, such as, for example, a solution #106 consisting of 30% by volume of dimethylsulfoxide and 70% by volume of monoethanolamine. However, such oxidizing agent has problems, including its lower oxidation power than hot concentrated sulfuric acid and a mixture of hot concentrated sulfuric acid and hydrogen peroxide, and the difficulty of treating the foul solution which is immiscible with water.

In order to overcome the problems of the above methods [1] and [2], a method of removing a photoresist film using a mixture of ozone with hot sulfuric acid as the oxidizing agent has been proposed (Japanese Patent Kokai Publication No. Sho 57 (1982)-180132). This publication discloses decomposing and removing the organic substance (i.e. the photoresist film) or the inorganic substance deposited on the substrate or the insulating layer by bubbling an ozonized gas in hot sulfuric acid. It also describes a washing apparatus used in the method cross sectional view of the apparatus is illustrated in FIG. 8).

The washing apparatus shown in FIG. 8 includes a quartz container 6" filled with hot concentrated sulfuric acid 5' heated at approximately 110° C., which is laid on a heater 11, and a quartz tube 120 having plural of outlet 3'. A raw gas (generally, oxygen) supplied through a gas-introducing tube 111 provided outside the quartz container 6" is converted to an ozonized gas in on an ozone generator 1. The ozonized gas is then injected through the quartz tube 120 into hot concentrated sulfuric acid 5' in the quartz container 6 to react with sulfuric acid, and thereby, peroxosulfric acid and an oxygen atom are produced. Oxidizing the photoresist film with the strong acidity of both peroxosulfric acid and oxygen causes the removal of the photoresist film from the surface of the substrate 8 (held with a substrate cassette 9) immersed in hot concentrated sulfuric acid.

In the method described in the above publication, the concentration of the sulfuric acid does not change since water is not generated during the decomposition of the photoresist film, and therefore, the frequency of changing the sulfuric acid may be decreased. The method, however, had a problem that the cost for raw materials is too high because a large amount of the sulfuric acid is needed to operate. Additionally, the method and apparatus disclosed in the above publication also have a high risk on working because of the use of strong sulfuric acid at an increased temperature in the same way as the conventional method, and also needs an extremely strong ventilation since the oxidizing agent is volatilized by bubbling the ozonized gas.

Accordingly, an object of the present invention is to provide a method of removing a photoresist film at an increased rate, which decreases both usage of the raw materials and the cost for any exhaust system and is also environment-friendly, and to further provide an apparatus used in the method, in order to overcome the above problems with the art-known method of removing the photoresist film and with the conventional apparatus used therefore.

Definition of the Technical Terms

As using herein, an "ozonized gas" means a gas mixture containing oxygen and a given amount of ozone. Hereinafter, a "sealed system" is thermodynamically classified into an open system, but it means one in which any of a gas and a solution are introduced therein and a gas or a vapour generated in removing a photoresist film according to the present invention, and the like, are not to be released or spattered outside of the system forms.

SUMMARY OF THE INVENTION

According to the first aspect of the present invention there is provided a method of removing a photoresist film by in a sealed system, evenly and continuously or intermittently supplying a photoresist film-removable mixture containing an ozonized gas and a photoresist film-remover to a photoresist film formed on a surface of a substrate through a photoresist film-remover supplier arranged as opposed to the photoresist film. The ozonized gas used in the present invention contains in an amount of at least 5 mole %, preferably 5 to 100 mole % of ozone based on the total amount of the ozonized gas.

In the method of the present invention, a distance between a surface of the photoresist film on the substrate and the photoresist film-remover supplier may be within a range of 1 to 5 mm. By adjusting the distance to the above range, a rate of removing the photoresist film in the method according to the present invention may be further increased.

In the method of the present invention, the ozonized gas and the photoresist film-remover may be supplied separately or in a mixed form. The ozonized gas may be supplied under a high pressure of a range between 1 atm (101, 325 Pa) and 5 atms (506, 625 Pa).

A suitable photoresist film-remover used in the present invention may be selected from organic solvents having a lower reactivity with ozone, including saturated alcohols, ketones and carboxylic acids.

In the method of the present invention, both a temperature of the photoresist film-remover and a temperature at a region apart at least 5 mm from the surface of the substrate are preferably set at a lower temperature than the surface of the substrate.

In the present invention, most preferably, the ozonized gas may be continuously supplied, and the photoresist film-remover may be intermittently supplied.

Further, the method of the present invention may comprise a means of generating an electric field between the photoresist film-remover supplier and the surface of the substrate. By the means, the photoresist film-remover may be converted to a microparticle.

The second aspect of the present invention relates to an apparatus comprising a reacting chamber equipped with an ozonizer and an exhaust system, a stage for fixing the substrate having the photoresist film on the surface thereof, and a photoresist film-remover supplier arranged as opposed to the stage, wherein the stage and the photoresist film-remover supplier are distributed in the reacting chamber. An ozonized gas and a photoresist film-remover which are used as the photoresist film-removable mixture may be continuously or intermittently supplied to the surface of the substrate through the same or different apertures formed in the photoresist film-remover supplier.

In the apparatus of the present invention, the reacting chamber may be made of stainless steel or Teflon®-coated stainless steel, Teflon® resin, ceramics or Teflon®-coated ceramics, or a mixture thereof.

The ozonized gas used in the apparatus contains at least 5 mole %, preferably 5 to 100 mole % of ozone based on the total amount of the ozonized gas.

The ozonized gas and the photoresist film-remover may be preliminarily mixed to supply as the photoresist film-removable mixture. In this case, the ozonized gas and the photoresist film-remover are preferably preliminarily mixed to send the mixture thereof to the photoresist film-remover supplier and then supplied through the apertures.

In the apparatus of the present invention, a distance between a surface of the photoresist film on the substrate and the photoresist film-remover supplier may be within a range of 1 to 5 mm. The apparatus may also comprise a means of heating the stage and/or a means of cooling the photoresist film-remover. By using them, both a temperature of the photoresist film-remover and a temperature at a region apart at least 5 mm from the surface of the substrate may be set at a temperature lower than the surface of the substrate.

The apparatus may further comprise a means of heating the stage and/or a means of cooling the photoresist film-remover.

In the present invention, the ozonized gas may be supplied to the apparatus under a high pressure of a range between 1 atm (101, 325 Pa) and 5 atms (506, 625 Pa).

A suitable photoresist film-remover used in the apparatus of the present invention may be selected from organic solvents having a lower reactivity with ozone, including saturated alcohols, ketones and carboxylic acids.

The apparatus of the present invention may also comprise a means of generating an electric field between the photoresist film-remover supplier and the substrate.

PREFERRED EMBODIMENTS OF THE INVENTION

A method of the present invention and an apparatus used in the method will be described in detail below by way of preferred embodiments. It should be noted, however, that the present invention is not limited to these embodiments, and various changes and modifications that are apparent for those skilled in the art are within the scope of the present invention.

Embodiment 1

Figure 1:
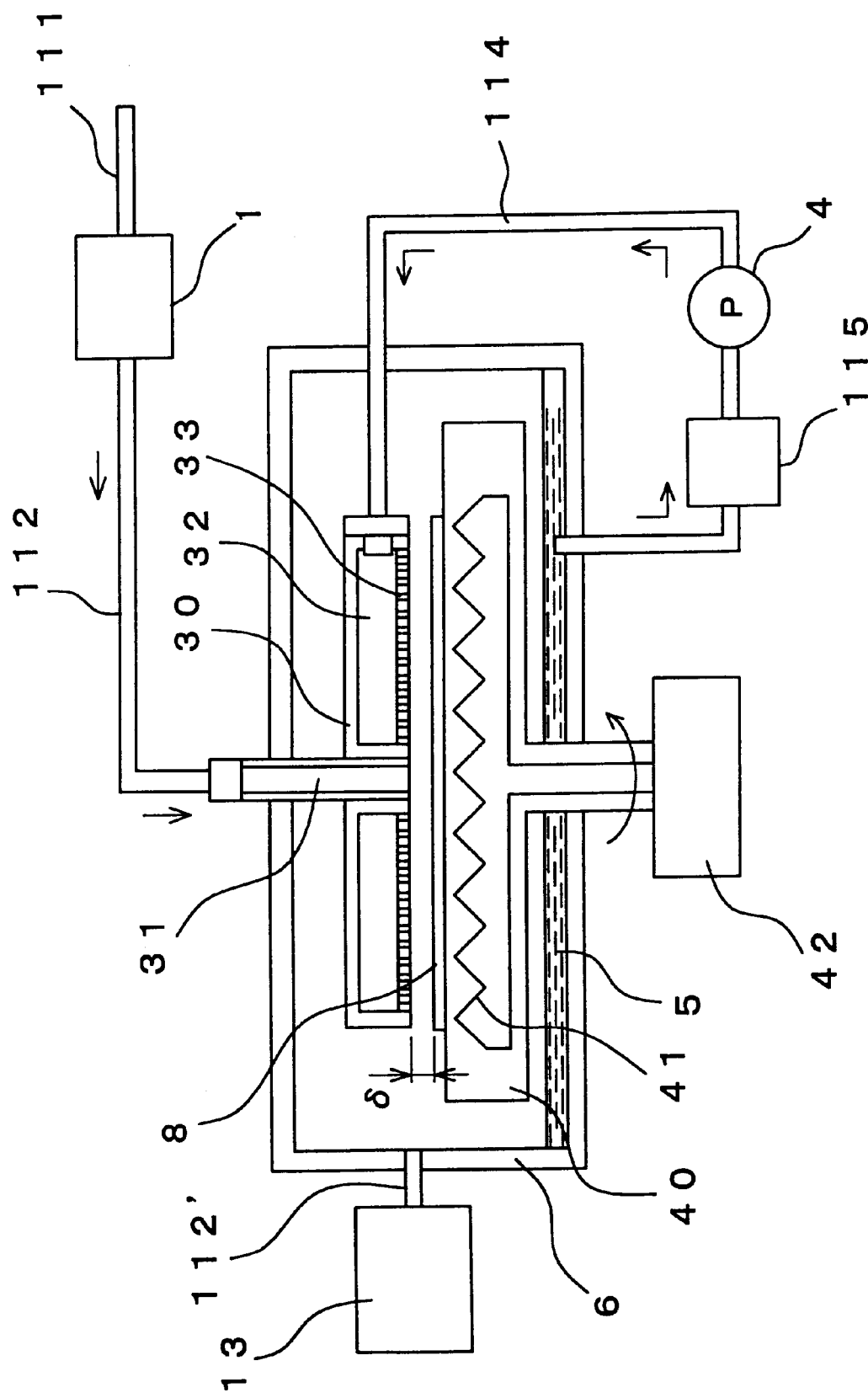
FIG. 1 schematically shows a cross-sectional view illustrating an apparatus (A1) for removing the photoresist film of the present invention as a embodiment 1.

FIG. 1 shows an aspect of the apparatus used for the method of the present invention. FIG. 1 illustrates one example of an apparatus for processing a substrate, in which a substrate having photoresist film formed on the surface of the substrate is charged one by one to process (generally called a "single wafer processing apparatus" in the art).

In the present application, the photoresist film to be removed may include either a film formed from a photoresist material containing an organic polymer compound, which the photoresist material is used in any processes of manufacturing semiconductor devices, a film decomposed by heating, a film of which the surface is modified by heating or heavy doping, or a film having a surface on which an inorganic substance is deposited in an etching process.

For a substrate having the photoresist film on the surface thereof, there is no particular limitation as long as the substrate is of the type commonly used in the production of semiconductor devices and, for example, silicon wafer, glass substrate for liquid crystal display device, glass epoxy sheet for packaging electronic circuits and the like are included.

The substrate of which the surface has the photoresist film may include silicon wafer, a glass substrate for a liquid crystal display device, a glass-reinforced epoxy substrate used for producing a printed-circuit, and the like, but is not particularly limited thereto as long as it may be any one commonly used in the manufacture of semiconductor devices.

An apparatus (A1) of the present invention shown in FIG. 1 has a stage 40 that carries the substrate 8 fixed thereon and can be trochoid at the center of mass thereof, and a gas/liquid supplier 30 disposed as opposed to the stage 40, in a closed space covered with a reaction vessel 6.

In the stage 40, there has a heating means 41 capable of heating the substrate 8 laid on the stage 40. The rotation and the heating of the stage 40 are controlled by a control unit 42 disposed below the reaction vessel 6.

The gas/liquid supplier 30 is provided with an ozonized gas feed tube 31 at the center of the supplier 30, and a photoresist film-remover reservoir 32 around the ozonized gas feed tube 31, as well as a photoresist film-remover injection outlet 33 provided below the reservoir 32.

An oxygen-containing gas as a stock gas is supplied through a gas feed tube 111, and then at least 5 mole %, preferably from 5 to 100 mole % of total amount of the gas containing oxygen gas is converted to ozone by an ozone generator 1 to obtain the ozonized gas.

More amount of ozone is contained in the ozonized gas, higher rate of removing the photoresist film is obtained, but the amount of ozone contained in the ozonized gas may be varied depending on the size of the substrate to be processed and the type of the photoresist used in the process. An amount of the oxygen-containing gas fed to the ozone generator 1 may be varied depending on the required amount of the ozonized gas to be supplied and on an actual amount of the ozonized gas subsequently supplied to the substrate.

In the apparatus (A1) shown in FIG. 1, the ozonized gas is controlled to a predetermined pressure before the supplement thereof through the feed tubes 112 and 31 to the substrate 8.

The photoresist film-remover that can be used in the present invention may be selected from a group consisting of pure water; an aqueous acid solution such as sulfuric acid, hydrochloric acid, nitric acid, acetic acid and hydrogen peroxide; an aqueous alkaline solution such as ammonium hydroxide; an organic solvent including ketones such as acetone and alcohol such as isopropanol; and a mixture thereof, having low reactivity with ozone. Although the use of pure water is most preferable in view of the disposal of waste liquid or gas and the like, it is desired to use a solvent other than pure water or a mixture thereof when it is intended to increase a rate to remove the photoresist film, or to remove a film that has been modified by heavy ion doping or contaminants deposited on the substrate.

The photoresist film-remover is fed through the feed tube 114 into the photoresist film-remover reservoir 32 in the reaction vessel 6, and is ejected from the outlet 33 distributed therebelow toward the substrate 8 when required.

The process of removing the photoresist film using the apparatus (A1) shown in FIG. 1 will be described below.

First, the substrate is fixed on a stage 40. Then the ozonized gas and the photoresist film-remover are supplied through the feed tube 31 and the injection hole 33 to the substrate 8, respectively. The ozonized gas and the remover supplied through the feed tube 31 is spattered from the center to the periphery of the substrate 8, and contact with the whole of the photoresist film.

While the photoresist film on the substrate surface is oxidized and decomposed by contacting with the ozonized gas, and reduces the molecular weight of an organic component contained in the photoresist film, a coating of the photoresist film-remover is formed on the photoresist film. The photoresist film having the reduced molecular weight may be dissolved in the coating of the photoresist film-remover, washed off by another supplement of the photoresist film-remover, and then removed from the surface of the substrate.

In the apparatus (A1) according to the present invention shown in FIG. 1, the ozonized gas is supplied at a constant high pressure from a position corresponding to the center of the substrate.

The present inventors have found that the pressure of the ozonized gas supplied to the apparatus has functionality to the rate to remove the photoresist film, and that when the pressure increases, the rate can be improved substantially in proportion to the pressure. Accordingly, in the present invention, the ozonized gas is supplied at a constant high pressure between preferably from 1 atm (101, 325 Pa) and 5 atms (506, 625 Pa), in view of the reliability and the safety of the apparatus used in the process, in the present invention.

Additionally, in the present invention, the ozonized gas is preferably supplied continuously. By continuously supplying the ozonized gas, ozone can be maintained to uniformly supply to the entire surface of the substrate even when ozone contained in the ozonized gas contacts with the photoresist film and is consumed by the oxidation and decomposition, and at the result, the uniform removal of the photoresist film can be achieved.

Although ozone contained in the ozonized gas is preferably consumed only in the reaction of removing the photoresist film, ozone may be consumed by reacting with materials other than the photoresist film (for example, inner wall of the reaction vessel or a part of the apparatus, or the like) because of the high reactivity of ozone. In order to avoid such waste of ozone, the reaction vessel and the part of the apparatus may be preferably made of stainless steel or Teflon®-coated stainless steel, Teflon® resin, ceramics or Teflon®-coated ceramics, or a mixture thereof.

At the same time of the supplement of the ozonized gas, the photoresist film-remover is supplied from the plural photoresist film-remover outlets 33 provided in the gas/liquid supplier 30.

In order to achieve effective removal of the photoresist film, at least ten outlets 33 may be preferably distributed corresponding to the whole surface of the substrate 8, each of which a diameter is about 1 mm or less.

Figure 2:
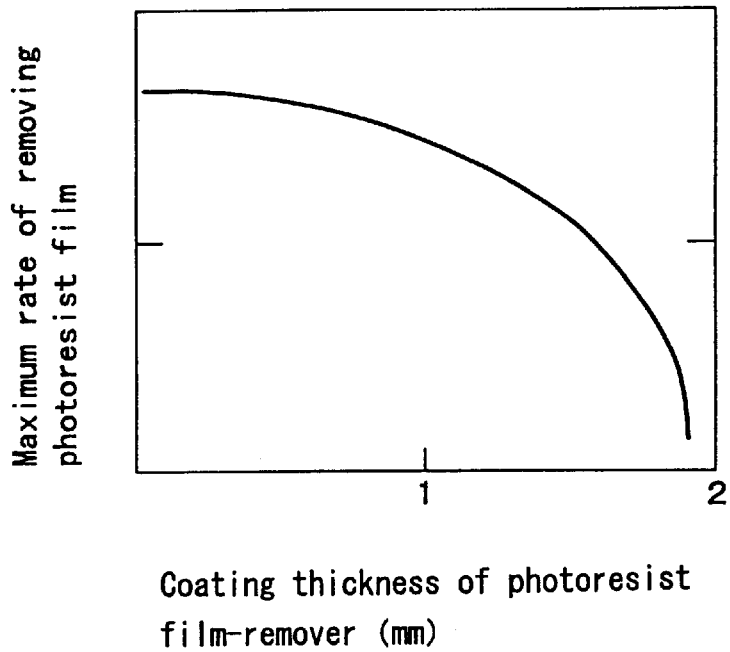
FIG. 2 shows a graph illustrating a maximum rate of removing the photoresist film versus a coating thickness of the photoresist film-remover on the surface of the substrate to be processed.

As the photoresist film-remover is supplied as described above, it may be observed that a thick coating of the solution is formed on the surface of the photoresist film. FIG. 2 illustrates the relation of the coating thickness of the remover (mm) to the maximum rate to remove the photoresist film. The coating thickness is determined by visual observation. FIG. 2 shows that the rate to remove the photoresist film can be sufficiently high when the coating thickness is 1 mm or less. It is due to that less thickness of the coating formed on the photoresist film is, easier ozone penetrates to the coating.

However, since the coating thickness of 1 mm or less is difficult to form by continuously supplying the remover, the photoresist film-remover is preferably supplied intermittently (most preferably every 1 to 360 seconds) according to the present invention.

The present inventors have also found that in the apparatus described above, the rate to remove the photoresist film is significantly affected by the distance between the gas/liquid supplier 30 including the ozonized gas feed tube 31 and the surface of the substrate 8 (denoted as δ in FIG. 1).

Figure 3:
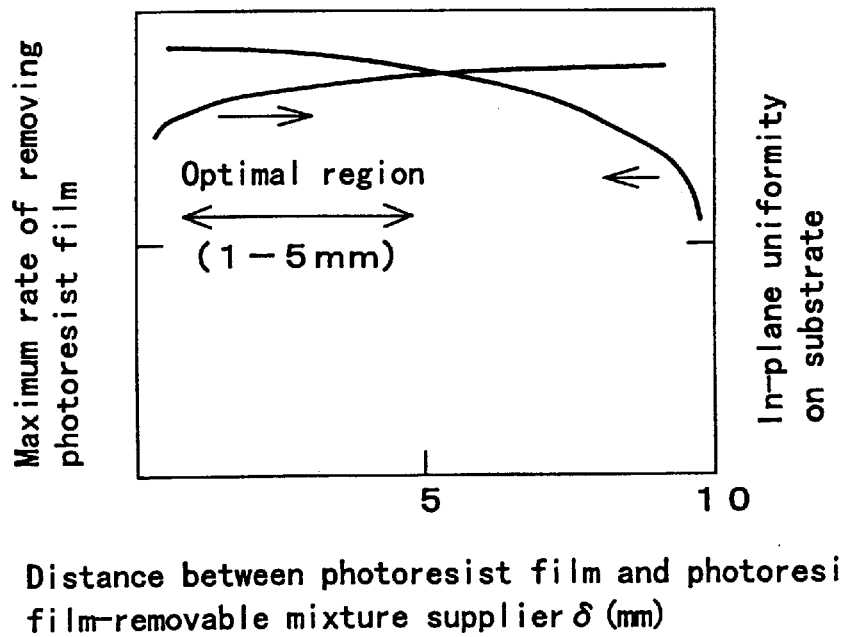
FIG. 3 shows a graph illustrating a maximum rate of removing the photoresist film and a degree of an in-plane uniformity on the surface of the substrate versus a distance (δ) between the photoresist film and the photoresist film-remover supplier in the method of the present invention.

FIG. 3 illustrates variations of both maximum rate to remove the photoresist film and a degree of the in-plane uniformity of the rate on the substrate as a function of the distance (mm). FIG. 3 shows that less the distance is, higher the maximum rate is, and that more the distance is, higher the degree of the in-plane uniformity. This results with reference to FIG. 1 is considered as follows: Since less the distance between the gas/liquid supplier 30 and the surface of the substrate 8 is, faster the flow rate of the ozonized gas through the clearance between them is, and thereby the apparent amount of ozone supplied to the surface of the substrate may increase, the rate of the oxidation and the decomposition of the photoresist film may be also improved. However, when the distance is too narrow, there may occur a position where the flow of the ozonized gas on the surface of the substrate becomes non-uniform.

Based on the above discussion, the distance (δ) between the gas/liquid supplier 30 and the surface of the substrate 8 is preferably set in a range from about 1 to 5 mm.

In order to carry out the removal of the photoresist film more efficiently using the method of the present invention, the substrate may be heated. Heating of the substrate 8 is conducted using the heating means 41 provided in the stage 40 (FIG. 1). The temperature of the heating means 41 may be controlled by a control unit 42 laid below the reaction vessel 6.

Although the oxidizing and decomposition reaction of the photoresist film with ozone is accelerated as the substrate is heated to a higher temperature, the substrate may be damaged when the temperature is too high. Therefore, the temperature of substrate heated may be varied depending on the type of substrate used. For example, when using silicon wafer as the substrate, the temperature is preferably about 300° C. or less, when using glass substrate, it is preferably about 100° C. or lower.

When the substrate is heated as described above, the decomposition of ozone is also accelerated and the release of oxygen atoms having high reactivity of oxidization is increased, and thereby, the rate to remove the photoresist film by the decomposition may be also improved. At the same time, however, an increased temperature in the vicinity of the substrate may also cause the temperature of the ozonized gas feed tube 31 to rise. Thus ozone may be thermally decomposed in the feed tube so that the active oxygen atoms is sometimes impossible to reach the surface of the substrate.

Therefore, in the apparatus (A1, FIG. 1) of the present invention, since a temperature of the photoresist film-remover is lowered using a cooler 115 before its introduction to the reservoir 32, the ozonized gas feed tube 31 adjacent to the reservoir 32 may be cooled, and thereby the thermal decomposition of ozone other than in the vicinity of the surface of the substrate 8 can be prevented.

According to the present invention, in order to make it easier to supply the ozonized gas and the photoresist film-remover to the entire surface of the substrate, the substrate may be trochoid at the center of mass thereof by rotating the stage 40 shown in FIG. 1. Rotation of the stage 40 can be controlled with the control unit 42 to a desired speed.

In the apparatus (A1) of the present invention, an excess of the supplied photoresist film-remover 5 may be collected in the reaction vessel 6 and then reused. The collected remover may be passed through a filter or the like (not shown) to remove a residue of the photoresist film therefrom, and then sent through the cooler 115, the pump 4 and the feed tube 114 to reuse as the photoresist film-remover 5.

In the apparatus of the present invention, after an excess of the supplied ozonized gas is sent to a waste ozone processing device 13 through an ozonized gas discharge tube 112', the remaining ozone is converted to oxygen to release to the atmosphere, and therefore, atmospheric pollution by ozone can be prevented (FIG. 1).

According to the present invention, since the photoresist film is removed in the sealed container, harmful gas is not released to the atmosphere without requiring a large-scale ventilation facility. Material cost can also be reduced because the photoresist film-remover used in the process is circulated after the operation.

Embodiment 2

It has been described hereinbefore that according to the present invention, the rate to remove the photoresist film can be significantly increased by decreasing the thickness of the coating of the photoresist film-remover formed on the photoresist film to be treated. However, decreasing the thickness of the coating may be accomplished not only by intermittently supplying the remover as described in the embodiment 1, but by applying an electric field between the gas/liquid supplier 30 and the substrate 8 as shown in FIG. 4.

Figure 4:
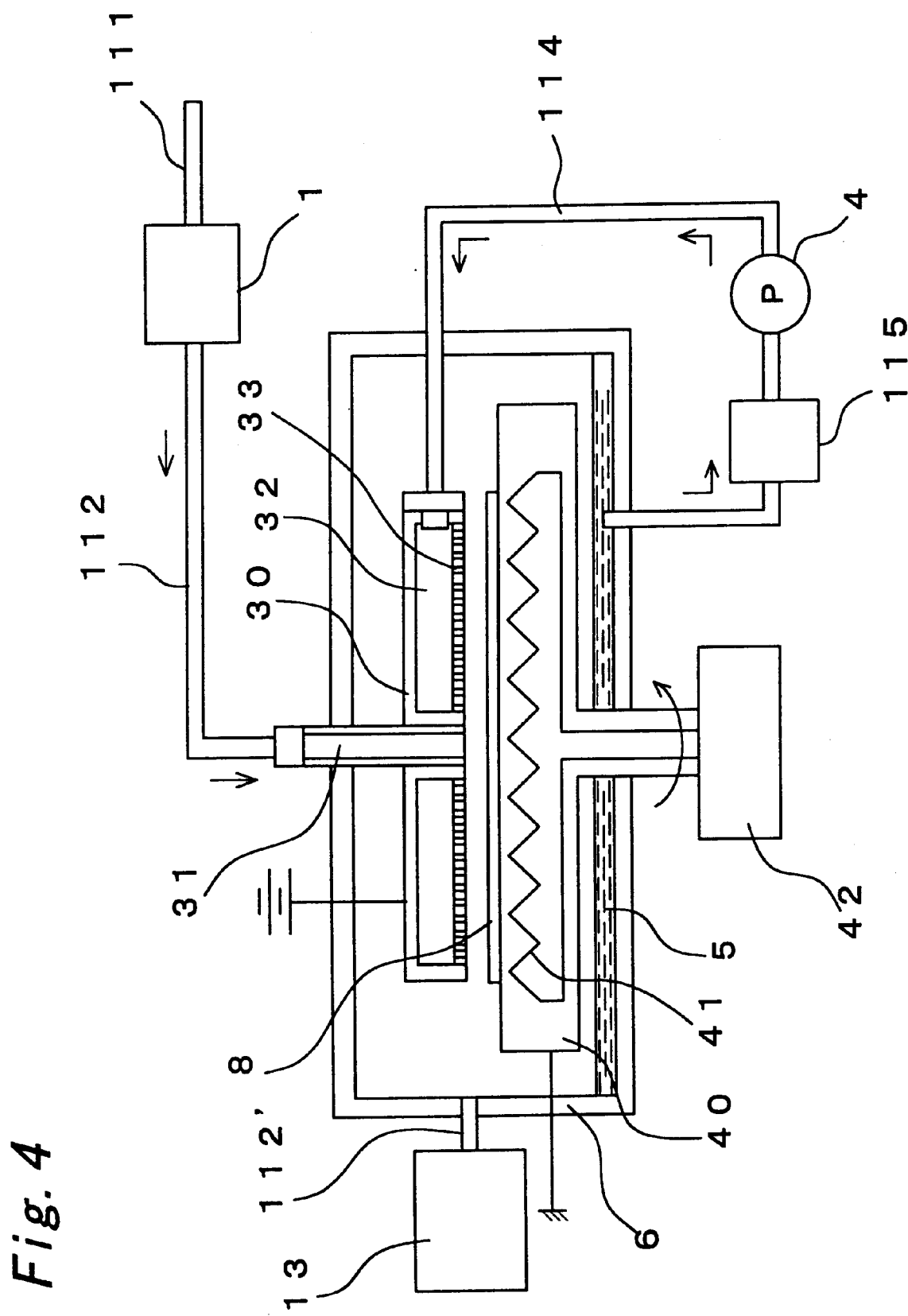
FIG. 4 schematically shows a cross-sectional view illustrating an apparatus (A2) for removing the photoresist film, as the embodiment 2 of the present invention, wherein the apparatus may generate an electric field between the photoresist film and the photoresist film-remover supplier.

FIG. 4 shows an example of an apparatus (A2) including a means for generating an electric field between the supplier 30 and the substrate 8 laid on the stage 40. In the apparatus (A2), the gas/liquid supplier 30 can be applied at several kilovolts or higher, and the stage 40 is grounded. The photoresist film-remover is supplied either continuously or intermittently, preferably intermittently. Applying the high voltage to the gas/liquid supplier 30 may be preferably performed when the photoresist film-remover is supplied from the outlets 33.

As the electric field is generated between the supplier 30 and the substrate 8 on supplying the photoresist film-remover, the remover ejected from the outlets 33 is spattered in the form of tiny droplets by the action of the electric field. The droplets of the remover may result in a very thin coating when it is deposited on the photoresist film on the surface of the substrate. As the remover is converted to the very thin coating, the oxidization and decomposition reaction with ozone may be accelerated, and at the result, the rate to remove the photoresist film may be increased.

As used herein, the means for generating the electric field shown in FIG. 4 is intended to be a mere example so that the present invention is not limited thereto. The apparatus (A2) shown in FIG. 4 may be the same as the apparatus (A1) described in the above embodiment 1, with the exception of the means described above, elements and functions specifically described above.

Embodiment 3

For the apparatus used for the method of the present invention, in the embodiments 1 and 2, the ozonized gas is supplied from the ozonized gas feed tube 31 corresponding to the center of the substrate, and the photoresist film-remover is supplied from the photoresist film-remover injection outlet 33 located on the periphery of the feed tube 31 (A1 and A2 shown in FIG. 1 and FIG. 2). Herein, each positions of supplying the ozonized gas and the photoresist film-remover may be interchanged if required.

Figure 5:
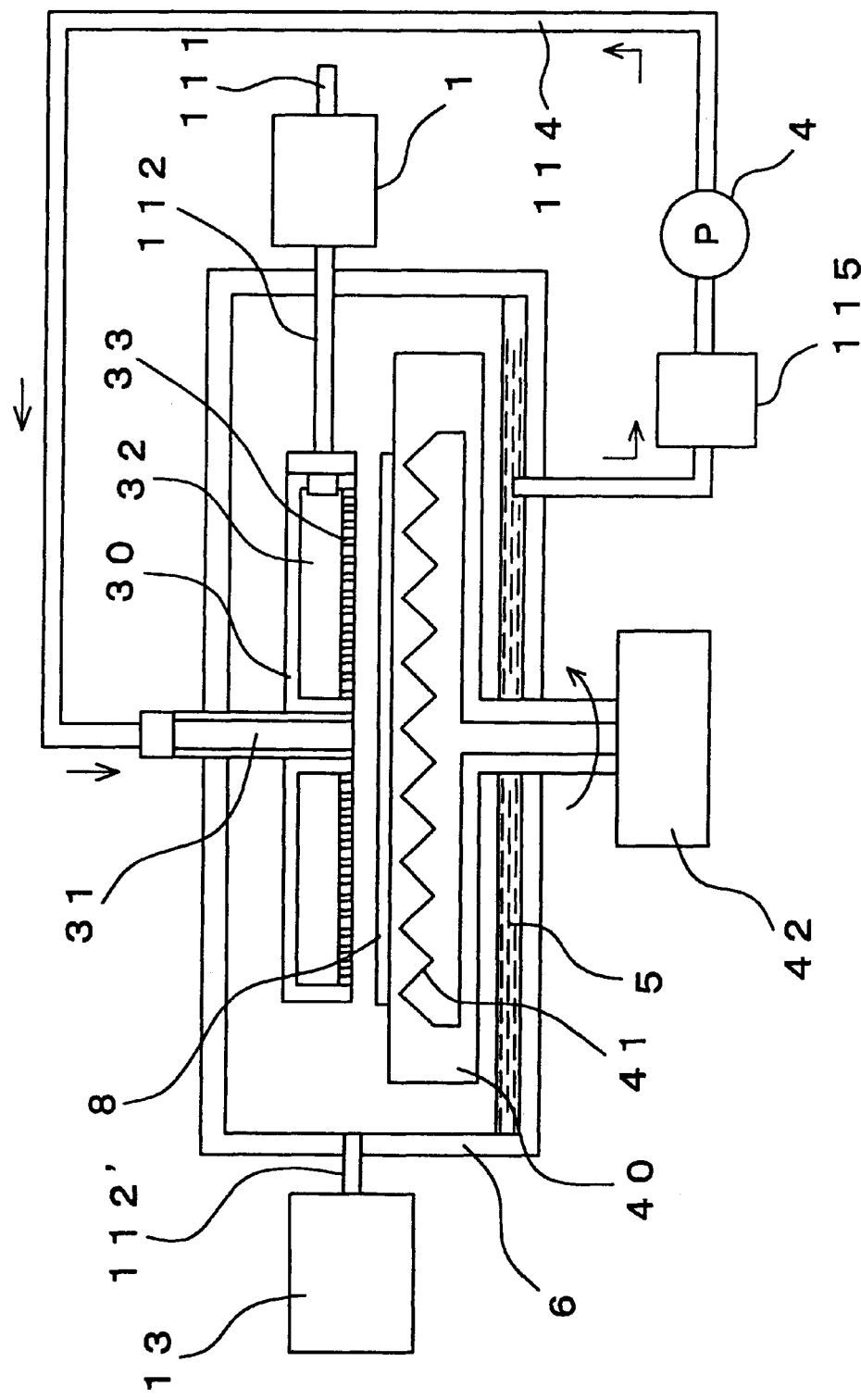
FIG. 5 schematically shows a cross-sectional view illustrating an apparatus (A3) for removing the photoresist film, as the embodiment 3 of the present invention.

For example, as shown in an apparatus (A3) of FIG. 5, the photoresist film-remover may be supplied from the feed tube 31 corresponding to the center of the substrate and the ozonized gas may be supplied from the outlets 33 located on the periphery of the feed tube 31.

In this case, preferably, the ozonized gas is continuously supplied and the photoresist film-remover is intermittently supplied, but these conditions for preparing the ozonized gas and the type of the photoresist film-remover used in the process may be the same as those described in the embodiment 1.

The apparatus used in this embodiment 3 may be the same as that of the embodiment 1, with the exception of the means and conditions used for supplying as described above.

Embodiment 4

According to the present invention, the ozonized gas and the photoresist film-remover may be supplied to the reaction vessel 6 either separately or as a mixture thereof. The embodiments 1 to 3 have described for the methods and apparatuses used to separately supply the ozonized gas and the photoresist film-remover. In this embodiment 4, the method and apparatus will be illustrated below, including mixing the ozonized gas and the photoresist film-remover to supply a mixture thereof to the reaction vessel 6 (FIG. 6 and FIG. 7), in order to make it easier to supply the ozonized gas and the photoresist film-remover to the entire surface of the substrate.

Figure 6:
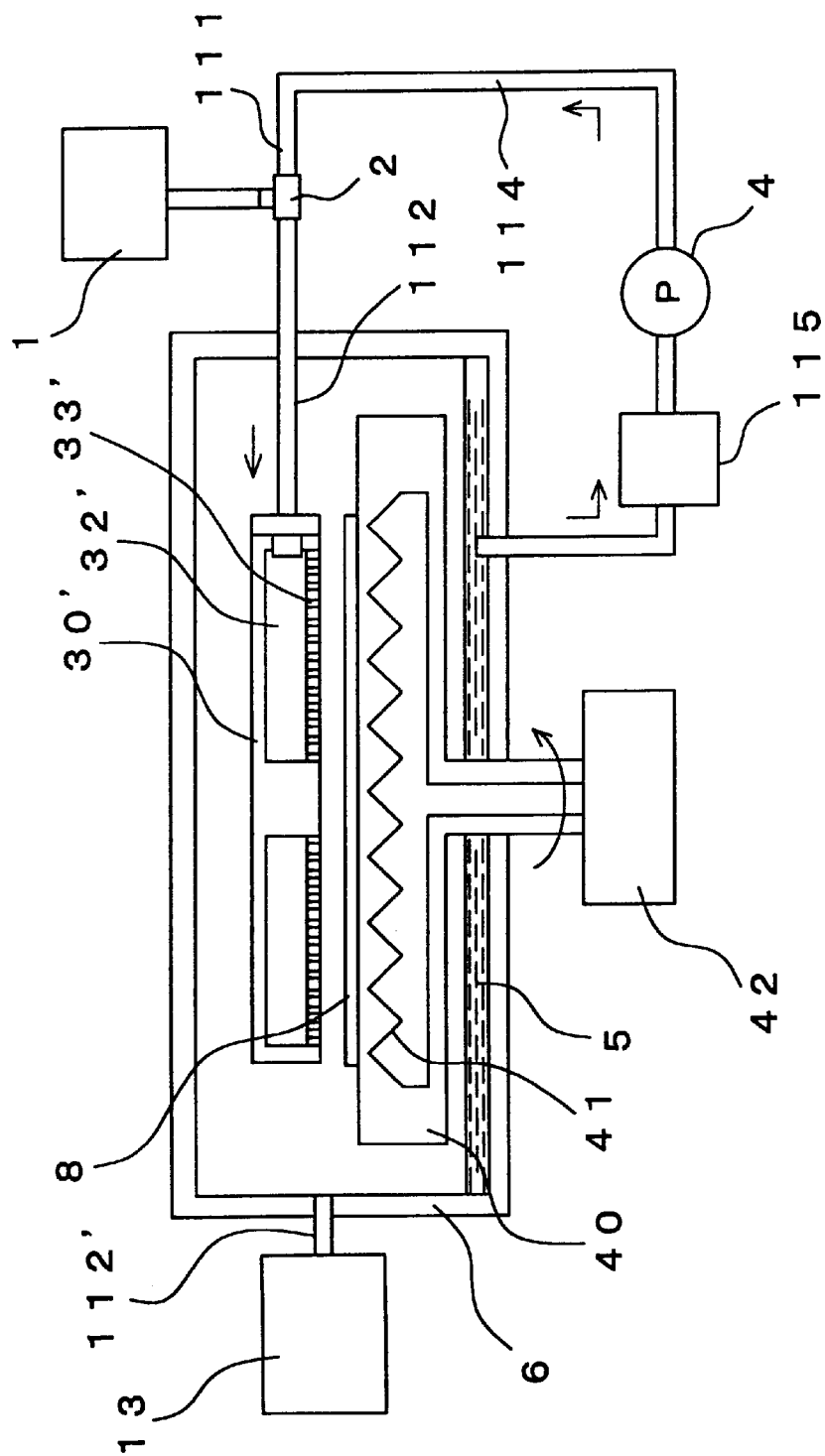
FIG. 6 schematically shows a cross-sectional view illustrating an apparatus (A4) for removing the photoresist film according to an embodiment 4 of the present invention, wherein the apparatus can supply the mixture of the ozonized gas and the photoresist film-remover.
Figure 7:
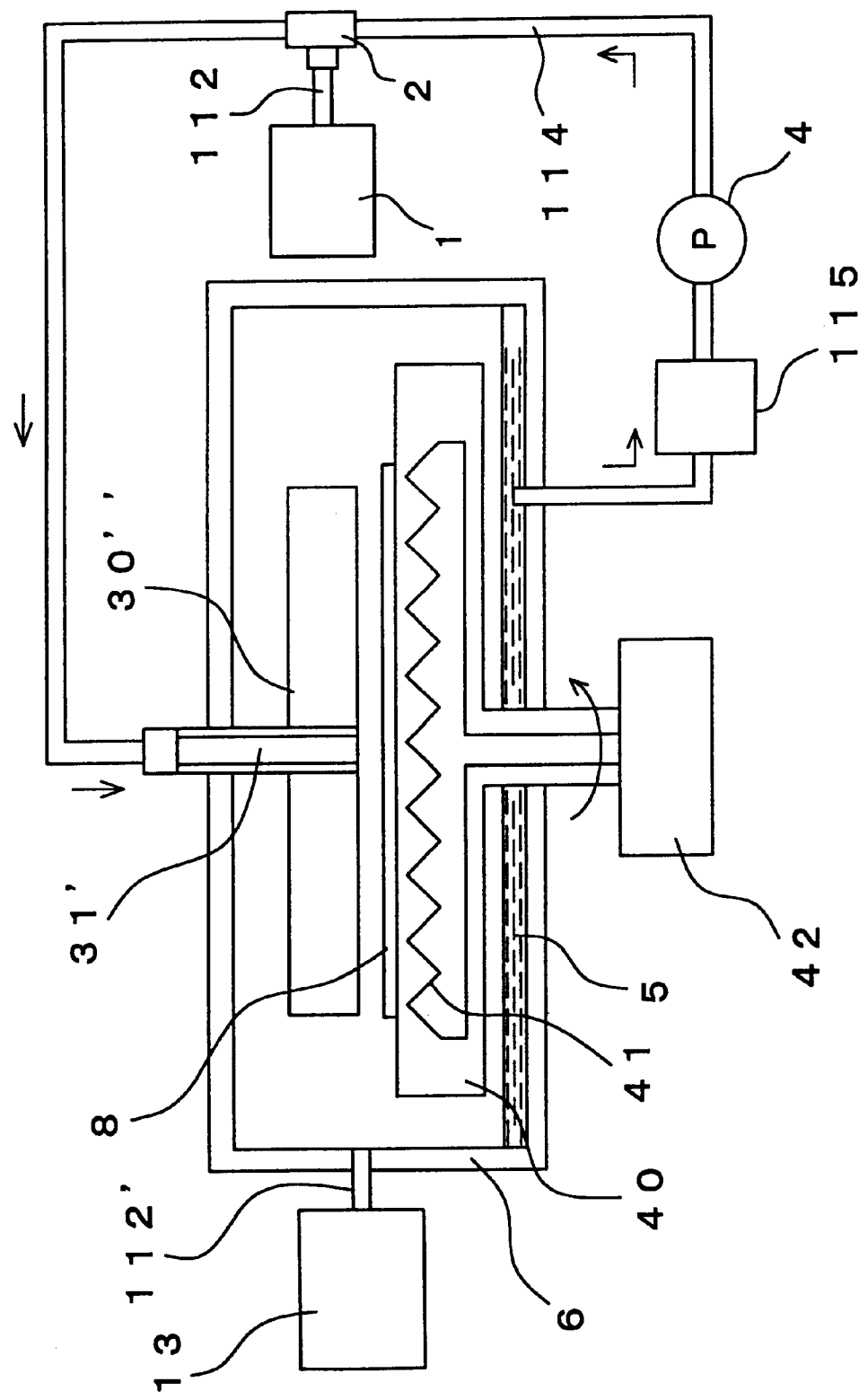
FIG. 7 schematically shows a cross-sectional view illustrating another apparatus (A5) for removing the photoresist film according to the embodiment 4 of the present invention, wherein the apparatus can supply the mixture of the ozonized gas and the photoresist film-remover.

In the apparatuses (A4 and A5) shown in FIG. 6 and FIG. 7, while the ozonized gas generated in the ozone generator 1 is sent through the feed tube 111 to the ejector 2 and, the photoresist film-remover is supplied through the feed tube 114 to the ejector 2. After mixing the ozonized gas and the photoresist film-remover in the ejector 2, the mixture is supplied through the feed tube 112 to the supplier 30' (FIG. 6) or 31' (FIG. 7). Thus, the apparatus (A4) shown in FIG. 6 equips a reservoir 32' and a outlet 33' in the supplier 30', similar to those of the apparatus (A1) of the embodiment 1, so that the mixture may be ejected from the outlets 33' to the substrate. Alternatively, in the apparatus (A5) shown in FIG. 7, the mixture can be supplied directly from the feed tube 31' distributed at a position corresponding to the center of the substrate.

In this embodiment 4, concentration of the ozonized gas incorporated into the photoresist film-remover, particularly the effective concentration of the ozonized gas incorporated, may be varied depending on an amount of ozone contained in the ozonized gas and the type of the remover used in the process. For example, when pure water is used as the remover, the amount of ozone may be, preferably in the state of saturation, within a range from about 10 to 200 ppm at 20° C.

Further, in the method and apparatus of this embodiment 4, it is preferable that the ozonized gas is continuously supplied and the photoresist film-remover is intermittently supplied, in order to increase the rate to remove the photoresist film. That is, in the apparatuses (A4 and A5) according to the present invention, for example, the mixture and the photoresist film-remover containing no ozonized gas can be supplied alternately onto the surface of the substrate.

In either of the apparatuses shown in FIGS. 6 and 7, the substrate can be trochoid at the center of mass thereof in the same way as described in the embodiment 1, in order to make it easier for the mixture and the remover to diffuse to the entire surface of the substrate.

The apparatus used in this embodiment 4 may be the same as that of the embodiment 1, with the exception of the devices, functions and conditions specifically described.

Embodiment 5

Figure 8:
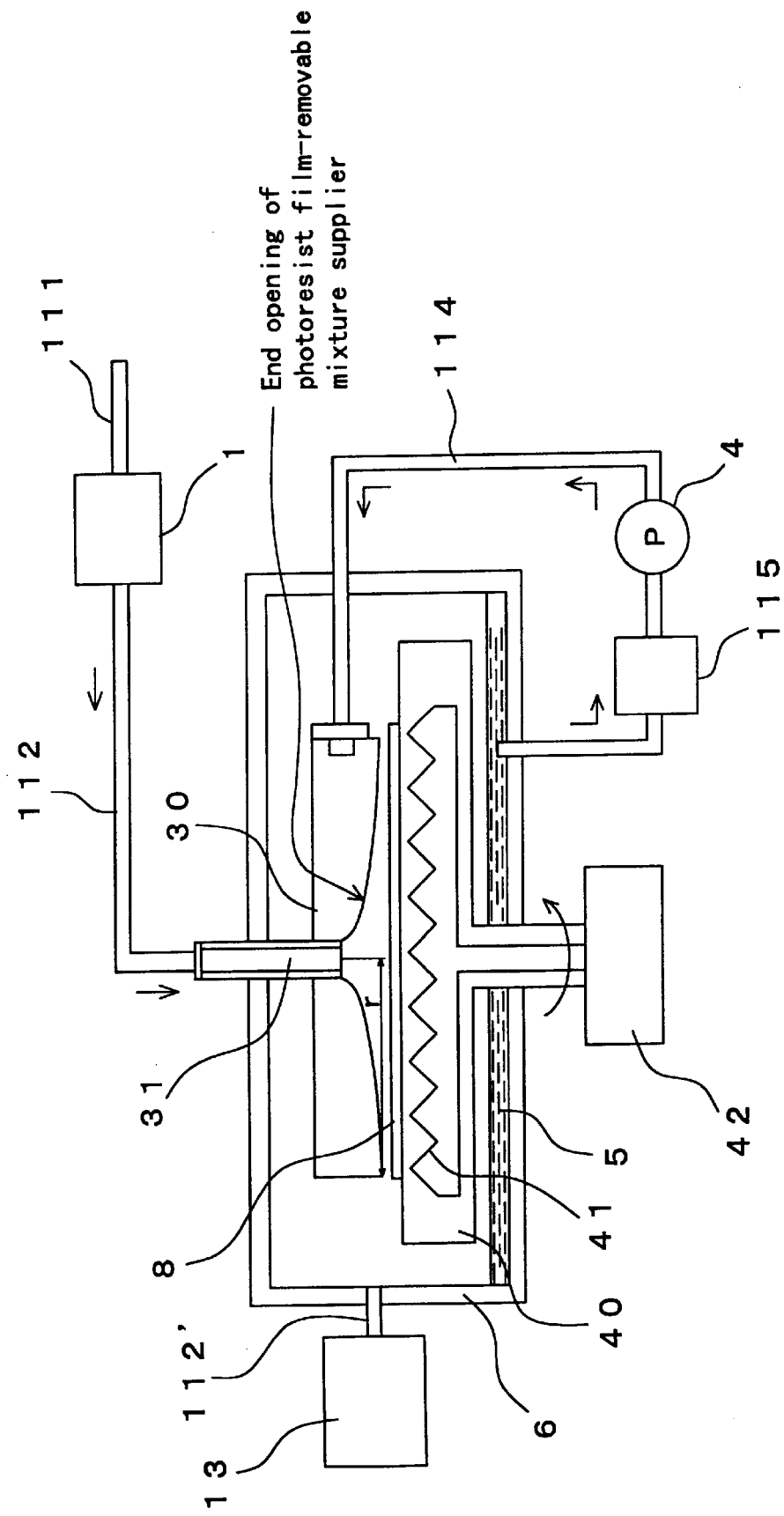
FIG. 8 schematically shows a cross-sectional view illustrating an apparatus (A6) for removing the photoresist film of the present invention as the embodiment 5.
Figure 9:
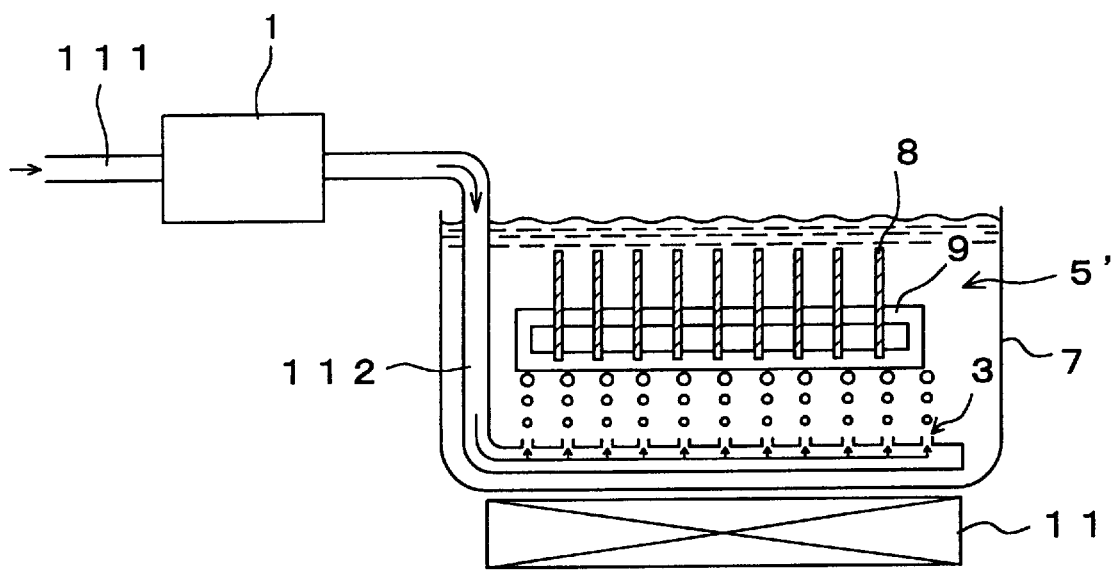
FIG. 9 schematically shows a cross-sectional view illustrating a washing apparatus used in a method described in Japanese Patent Kokai Publication No. Sho 57 (1982)-180132, for removing the photoresist film applied on the substrate or the insulating layer by bubbling the ozonized gas in hot sulfuric acid.

In an apparatus (A6) of this embodiment 5, that is a further improved version of the apparatus of the embodiments 1 to 3 according to the present invention, providing that the ozonized gas from the ozone generator 1 can be ensured to supply in a sufficient amount to process, the end opening of the ozonized gas feed tube 31 may be expanded toward the substrate 8 in a radially widened shape like a bell flare of a trumpet as shown in FIG. 8.

When the radius (or a length of the longitudinal side) of the substrate is r, the end opening of the ozonized gas feed tube 31 may be radially expanded toward the substrate gradually with a gradient of approximately 1/r. The widened shape may have a curved portion such as in the bell flare of a trumpet.

Such shape of the end opening of the ozonized gas feed tube 31 makes it possible to supply the ozonized gas more uniformly and more efficiently to the entire substrate.

In this embodiment 5, an injection outlet (not shown in FIG. 8) for ejecting the photoresist film-remover to the substrate 8 may be further provided along the end opening of the ozonized gas feed tube 31.

Effects of the Invention

According to the method of the present invention, since the photoresist film is removed in the sealed system and the photoresist film-remover can be circulated to reuse, costs of both ventilation facility and the starting material can be significantly reduced. Because the apparatus according to the present invention has an exhaust system, air pollution due to the discharge of an excess of the supplied ozone can be prevented.

According to the present invention, the rate to remove the photoresist film can be increased several times over the prior art because of the following capabilities:

(1) to supply the ozonized gas and the photoresist film-remover to the photoresist film evenly and either continuously or intermittently;

(2) to use ozonized gas, which contains ozone used to oxidizing and decomposing the photoresist film in a larger amount than the conventional way;

(3) to set the distance between the surface of the photoresist film applied on the surface of the substrate and the photoresist film-remover supplier disposed as opposed to the photoresist film former in most effective range (particularly, between 1 and 5 mm); and (4) to supply the ozonized gas at a high pressure from 1 atm (101, 325 Pa) and 5 atms (506, 625 Pa).

According to the present invention, the ozonized gas and the photoresist film-remover may be supplied either separately or in a form of a mixture. In either case, since the ozonized gas can be continuously supplied and the photoresist film-remover can be intermittently supplied, the rate to remove the photoresist film may be further increased.

Since the apparatus that is the second aspect of the present invention is made of a material which does not react with ozone, the ozonized gas can be effectively used only in removing the photoresist film.

In the apparatus of the present invention, the ozonized gas and the photoresist film-remover can be continuously or intermittently supplied from the same nozzle or different outlets provided in the photoresist film-remover supplier onto the substrate surface to use as the photoresist film removable mixture. The ozonized gas contains in an amount of at least 5 mole %, preferably from 5 to 100 mole % of ozone.

In the apparatus of the present invention, the rate to remove the photoresist film can be increased by incorporating the ozonized gas into the photoresist film-remover to supply a mixture thereof to the photoresist film.

Since the apparatus of the present invention includes a means for heating the stage and/or a means for cooling the photoresist film-remover, the temperature of the photoresist film-remover and the temperature at a position 5 mm or more away from the substrate can be set lower than the temperature on the surface of the substrate, and thereby the rate can be further increased.

Since the apparatus of the present invention is capable of supplying the ozonized gas at a high pressure in a range from 1 atm (101, 325 Pa) and 5 atms (506, 625 Pa), the sufficient amount of ozone can be caused to act on the photoresist film. The photoresist film-remover used in the present invention may be selected from any of those commonly used.

In addition, according to the present invention, a means for generating the electric field between the photoresist film-remover supplier and the substrate to convert the photoresist film-remover to a microparticle can be installed in the apparatus of the invention, and thereby, the rate of the oxidization and decomposition of ozone may be accelerated. As the result, it can provide a higher rate to remove the photoresist film.

What is claimed is:

1. A method of removing a photoresist film in a sealed system by supplying a photoresist film-removal mixture containing an ozonized gas and a photoresist film-remover to a photoresist film on a surface of a substrate through a photoresist film-remover supplier arranged opposite the photoresist film, wherein a distance between the photoresist film and the photoresist film-remover supplier is within a range of 1 to 5 mm.

2. The method according to claim 1, wherein the ozonized gas contains at least 5 mole % of ozone gas based on total amount of the ozonized gas.

3. The method according to claim 1, wherein the ozonized gas is supplied at a pressure in a range between 1 atmosphere (101, 325 Pa) and 5 atmospheres (506, 625 Pa).

4. The method according to claim 1, wherein both temperature of the photoresist film-remover and at a region apart at least 5 mm from the surface of the substrate are set at a lower temperature than the surface of the substrate.

* * * * *